United States Patent [19]

Barrell et al.

[11] Patent Number: 4,803,022

[45] Date of Patent: Feb. 7, 1989

[54] METHOD OF CONTINUOUSLY BONDING AND CURING A ZINC-COATED METAL-CLAD POLYESTER-EPOXY-GLASS FIBER LAMINATE

[75] Inventors: David Barrell, Temple City, Calif.; Gerald P. Griffith, Collierville, Tenn.; Donald E. Kennedy, Baldwin Park; Donald C. Rollen, Railto, both of Calif.

[73] Assignee: Glasteel Industrial Laminates, Inc., Collierville, Tenn.

[21] Appl. No.: 46,354

[22] Filed: May 6, 1987

[51] Int. Cl.[4] ...................... B29C 35/14; B29C 71/04
[52] U.S. Cl. ..................... 264/25; 156/275.5; 156/307.3; 156/307.4; 156/307.7; 264/171; 264/255; 264/257; 427/45.1; 427/206
[58] Field of Search ............... 264/25, 26, DIG. 46, 264/171, 255, 257; 425/174.8 R; 156/275.5, 307.4, 307.3, 307.7; 427/206, 45.1

[56] References Cited

U.S. PATENT DOCUMENTS

| | | | |
|---|---|---|---|
| 2,822,575 | 2/1958 | Imbert et al. | 425/174.8 R |
| 3,149,201 | 9/1964 | Huber et al. | 178/6.6 |
| 3,466,360 | 9/1969 | Chipman | 264/346 |
| 3,477,900 | 11/1969 | Soukup et al. | 161/194 |
| 3,674,445 | 7/1972 | Wlodek | 29/195 |
| 3,729,294 | 4/1973 | Hibbs, Jr. | 29/195 |
| 3,894,134 | 7/1975 | Williams | 264/174 |
| 3,988,408 | 10/1976 | Haining et al. | 264/104 |
| 4,093,768 | 6/1978 | Cordts et al. | 428/287 |
| 4,295,907 | 10/1981 | Cordts et al. | 264/216 |
| 4,410,388 | 10/1983 | Oizumi et al. | 156/307.3 |
| 4,420,509 | 12/1983 | Barrell et al. | 427/206 |
| 4,446,173 | 5/1984 | Barrell et al. | 427/206 |
| 4,579,612 | 4/1986 | Held | 156/307.7 |
| 4,587,161 | 5/1986 | Barrell et al. | 428/288 |
| 4,662,973 | 5/1987 | Gotou et al. | 156/307.4 |
| 4,673,541 | 6/1987 | Watanabe et al. | 425/174.8 R |

FOREIGN PATENT DOCUMENTS

| | | | |
|---|---|---|---|
| 60-6420 | 1/1985 | Japan | 264/25 |
| 1001018 | 8/1965 | United Kingdom | 264/25 |

*Primary Examiner*—Jeffery Thurlow
*Attorney, Agent, or Firm*—Spencer & Frank

[57] ABSTRACT

A metal foil laminate including at least one sheet of metal foil directly bonded to one face of a sheet of glass fiber reinforced polyester and epoxy resin, and a continuous process for preparing such laminates including post curing partially cured product by radio-frequency electromagnetic energy.

20 Claims, 1 Drawing Sheet

METHOD OF CONTINUOUSLY BONDING AND CURING A ZINC-COATED METAL-CLAD POLYESTER-EPOXY-GLASS FIBER LAMINATE

FIELD OF THE INVENTION

The invention relates to a method of continuously bonding and curing laminates of reinforced polyester and epoxy bonded to metal sheets used as circuit boards and E.M.I.-R.F.I. shielding materials.

TECHNOLOGY REVIEW

Electrical circuit boards and shieldings are prepared by laminating metal sheets, e.g., copper sheets, with sheets of electrical insulating materials, such as glass fiber reinforced unsaturated polyester resin sheets. Such electrical circuit boards and shieldings may be either rigid or flexible, and are further classified as single-sided (metal foil on one side of the insulating material only), double-sided (metal foil on both sides of the insulating material), or multilayered.

The electrical insulating material is a base or support for the metal sheets bonded thereto. The National Electrical Manufacturers Association (NEMA) has established standards for various base materials. Standards for polyester and epoxy glass-mat sheet laminates have been established by NEMA, viz. Grades GPO-1, GPO-2, and GPO-3.

Normally the metal foil, for example copper foil, is secured to the reinforced plastic sheet by means of a suitable adhesive. For example, U.S. Pat. No. 3,700,538 discloses adhesive bonding copper foil to resin-impregnated fiberglass cloth using polyimide resin adhesive. It is also known to add an adhesion promoter to the insulating base material. For example, U.S. Pat. Nos. 3,477,900 and 3,149,201 disclose that when the insulating base material comprises methylmethacrylate resin, then unsaturated polyester may be added to the resin as an adhesion promoter to bond a copper foil. However, these patents disclose an increase in the proportion of polyester is generally accompanied by a decrease in adhesion of the copper foil to the resinous base. As the proportion of polyester is increased beyond 45 parts by weight, per 100 parts of methylmethacrylate resin, the adhesion falls rapidly to an unacceptable value. U.S. Pat. No. 4,093,768 discloses that unsaturated polyester resin containing up to about 2% by weight of benzotriazole, incorporated into the resin as an adhesion promoter, can be bonded under pressure directly on a copper foil.

Alternatively, treatment of the surface of the metal foil has been suggested to promote adhesion. U.S. Pat. No. 3,674,445 discloses that a tightly adherent organic coating can be provided on a copper surface by interposing a vacuum vapor deposited zinc coating between the copper surface and the organic coating. U.S. Pat. No. 3,729,294 describes a method of promoting adhesion of a polymer insulating coating to a copper surface by forming a thin film of zinc on the surface and heating the surface to diffuse the zinc thereon, to obtain a zinc-diffused surface having the golden appearance of brass. As can be seen, these prior methods are generally complex and therefore expensive to practice.

Our prior United States patents describe improved metal-clad polyester-glass fiber laminates. U.S. Pat. No. 4,420,509 describes a continuous process for directly bonding an unsaturated polyester resin to a metal foil. U.S. Pat. No. 4,446,173 describes a continuous process for directly bonding an unsaturated polyester resin to a zinc-coated metal foil. U.S. Pat. No. 4,587,161 describes a continuous process of directly bonding an unsaturated polyester and epoxy resin to a zinc-coated metal foil. The products of our prior patents were post cured in hot air convection ovens to produce a finished product that is about 83% to 94% cured. Using a hot air convection oven, post curing typically takes from about 4 to 24 hours.

An improved method of continuously curing metal-clad polyester-glass fiber laminates to produce a finished product which is about 97% to 99% cured in less than one-tenth the time required by hot air convection ovens is now described.

SUMMARY OF THE INVENTION

The invention provides a rapid and economical continuous process for bonding and curing unsaturated polyester and epoxy resins to a metal foil, such as a copper foil, including post curing partially cured product by radio-frequency electromagnetic energy. The process may also be used to bond and cure epoxy resins to a metal foil such as a copper foil.

According to one preferred process of the invention, a uniform layer of catalyst-containing polyester and epoxy resin, optionally containing an adhesion promoter, is applied to a copper foil. Chopped glass fibers are randomly distributed into the resin layer, and the laminate is subjected to a heat treatment to initiate gelation. Alternately, a glass fiber mat is applied onto the resin layer, and the laminate is subjected to a heat treatment to initiate gelation. A second copper foil may be applied to the partially gelled resin. The laminate is thereafter cured in a multi-zone heat treatment, and post cured using radio-frequency electromagnetic energy.

The process of the invention provides laminates of fiber glass reinforced polyester and epoxy bonded to copper. Alternatively, the invention provides laminates of fiber glass reinforced epoxy bonded to copper. These laminates are useful as electrical circuit boards, and E.M.I. and R.F.I. shielding.

DETAILED DESCRIPTION OF THE INVENTION

Figure 1:
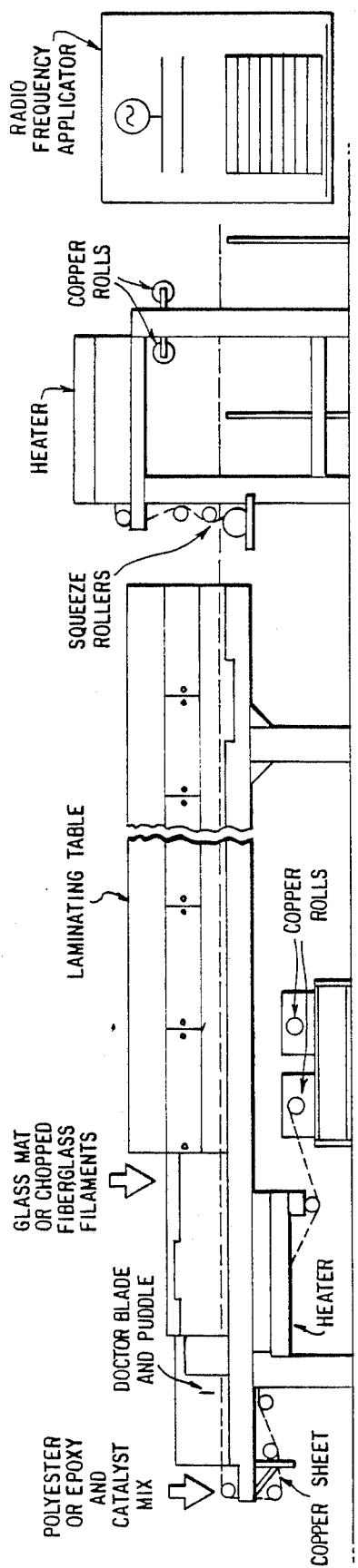
FIG. 1 is a schematic illustration of the process of the present invention.

The present invention provides a rapid and economical continuous process for bonding and curing copper-clad polyester and epoxy-glass fiber laminates, which are useful as electrical circuit boards, and E.M.I.-R.F.I. shielding. Electrical circuit boards employ a copper, or other metal, foil which is subsequently etched away to leave behind portions of the copper foil as electrical conductors. The copper foil thickness is customarily measured in terms of the number of ounces of copper per square foot of the foil. Electrodeposited foil is generally used in the manufacture of electrical circuit boards and E.M.I.-R.F.I. shielding. Electrodeposited foil is produced by plating on a stainless steel drum, from which the plated foil is continuously stripped. The inner surface of the resulting foil exhibits a smooth finish, whereas the outer surface is coarse, thereby promoting improved bonding with the increased surface area. In the improved process of the present invention, this coarse surface of the copper foil is zinc coated. The thickness of the foil is controlled by adjusting the solution concentration and the electrical and mechanical parameters of the plating process. Generally, electrical circuit boards and shielding employ copper foil of one or two ounces per square foot thickness. Foils of one ounce per square foot have an approximate thickness of 0.0014 inch (0.0036 cm), whereas two ounce foils have an approximate thickness of 0.0028 inch (0.0071 cm). The zinc coating applied to the coarse surface of the copper foil is preferably an electrogalvanized coating, and is typically from about 6 to about 10 microinches thick.

The copper foil used in the process of the present invention meets the standard developed by the "Institute for Interconnecting and Packaging Electronic Circuits," standard IPC-CF-150E, incorporated herein by reference. The copper foil may be heated before a coating of catalyzed polyester and epoxy resin is applied. Preheating the zinc-coated copper foil helps to avoid wrinkles and other surface imperfections which might interfere with adhesion of the zinc-coated copper foil to the polyester and epoxy resin. It is also believed that heating the zinc-coated copper foil makes the zinc-coated foil surface more receptive to adhesion to polyester and epoxy resin, although the mechanism of this effect is not known.

If desired, a cellophane carrier sheet may be used to support the zinc-coated copper foil. Plain transparent cellophane is suitable for this purpose. Cellophane made from polyethyleneterephthalate may also be used. In general, cellophane ranging from about 48 to about 174 gauge (about 0.12 to about 0.44 cm) may be used. In general, the heavier the copper foil used, the thicker the cellophane carrier sheet should be to minimize stress.

The unsaturated polyester resin used may generally be described as a linear polyester resin capable of crosslinking with vinyl monomers to form thermoset copolymers. Polyester resins comprising phthalic anhydride, maleic anhydride, propylene glycol, ethylene glycol, and styrene are suitable in the process and product of the present invention. Although the process of the present invention is primarily directed toward making rigid electrical circuit boards and shielding, the present invention also contemplates the preparation of flexible electrical circuit boards using the present process. To prepare flexible electrical circuit boards, a flexible unsaturated polyester and epoxy resin is used. Typical flexible unsaturated polyester resins comprise phthalic anhydride, maleic anhydride and diethylene glycol ($HOCH_2CH_2OCH_2CH_2OH$).

The polyester-epoxy resins used in the practice of the present invention contain from about 80% to about 90% by weight polyester, and from about 10% to about 20% by weight epoxy resin. A preferred range of polyester-epoxy resins contains from about 84% to about 88% by weight polyester, and from about 12% to about 16% by weight epoxy. Particularly preferred compositions contain about 86% polyester and about 14% epoxy.

The unsaturated polyester resin used in the process of the present invention contains a catalyst to promote crosslinking or thermoset structure. The primary consideration in selecting a catalyst is generally the temperature at which the curing process is to be carried out. For any given resin-catalyst system there is an optimum temperature at which the resin can utilize all of the free radicals formed by the catalyst decomposition at that temperature. Above that temperature, peroxide is wasted and below it too much time is required to complete cure. Catalysts useful in the process of the present invention include peroxides such as benzoyl peroxide or methylethylketone peroxide, or hydroperoxide such as cumene hydroperoxide, or other compounds which decompose to form active free radicals, such as t-butyl perbenzoate. In the process of the present invention, the amount of catalyst used is sufficient to achieve gelation in a time from about 1.5 minutes to about 4 minutes, and to achieve the exothermic stage of curing in a time from about 5 to about 8 minutes. This time interval (to achieve the exothermic curing stage) does not indicate the completion of the cure, but merely that the heat being generated by the curing reaction has reached a maximum.

Fire retardants such as bromine-containing compounds may be added to the polyester resin and catalyst. An adhesion promoter may also be added to the polyester resin and catalyst to increase the adhesion of the metal foil to the polyester resin insulating material. It has been found that sodium silicate is an effective adhesion promoter in the process of the present invention. Generally, an amount of sodium silicate solution from about 0.1% to about 1% by weight, compared to the polyester resin, may be used in the process of the present invention. Preferably about 0.5% by weight of a sodium silicate solution, compared to the polyester resin, is used and has been found effective as an adhesion promoter in the process of the present invention. A preferred sodium silicate solution, useful as an adhesion promoter in the process of the present invention, is sodium silicate D ®, sold by the PQ Corporation of Valley Forge, Pennsylvania. Sodium silicate D ® is characterized by a $SiO_2/Na_2O$ weight ratio of 2, and a density of 1.53 $g/cm^3$ at 20° C.

The epoxy resin systems used in this process are modified 4,4' isopropylidene diphenol/epichlorohydrin, with the use of Shell Chemicals designations, Epon 9801 and Epon-RSL-490, both using styrene monomers, along with proprietary additives. The Epon curing agent Epon 9850, and RSC-491 are curing agents for the appropriate resins. Shell Epon 9801 is used in conjunction with Epon 9850. Epon RSL-490 is used with RSC-491. Epon 9850 is a trimetallic anhydride with proprietary additives. RSC-491 is heterocyclic amine with proprietary additives. In accordance with the invention it has been found that the use of these epoxy systems alone or in conjunction with polyester resin systems results in outstanding increased peel bond strengths, particularly when using our continuous process.

If desired, fillers may also be added to the polyester and epoxy resin and catalyst. Typical fillers include Georgia kaolin, fused silica, alumina trihydrate, nepheline, and CA-5 calcium sulfate. The use of such fillers may improve the physical properties of the final laminate, including both mechanical and electrical properties. The amount of filler used may vary from about 5 to about 50 parts by weight, per 100 parts by weight of resin.

Glass fibers are used to reinforce the polyester and epoxy resins in the process of the present invention. In one embodiment, chopped glass fiber strands are randomly distributed into the resin layer as a reinforcing agent. In an alternate embodiment, a mat of glass fibers is applied to the resin at the same location, instead of chopped glass fiber strands. Glass is particularly useful as a reinforcing agent because of its high tensile strength, high modulous of elasticity, ability to be formed to small diameter fibers, inertness, and low specific gravity compared to equally strong fibers. In the embodiment of the present invention using chopped glass, glass fiber strands are chopped into filaments about two inches long, and randomly distributed into the polyester and epoxy resin layer. In the embodiment of the present invention using a glass mat, a mat of electrical grade glass fibers weighing from about ¾ ounce to about 12 ounces per square foot is uniformly applied to the polyester and epoxy resin layer. In general, in the process of the present invention, the weight of the glass fiber filaments distributed into the polyester and epoxy resin is from about 10% to about 30% by weight compared to the resin, preferably from about 10% to about 20% by weight compared to the resin, and most preferably from about 12% to about 15% by weight compared to the resin.

Referring to FIG. 1, according to one preferred process of the present invention, a zinc-coated copper (or other metal) foil, optionally carried on a cellophane sheet (not shown), is coated with a polyester and epoxy resin mixture containing catalyst. A coating of polyester and epoxy resin and catalyst is uniformly applied to the sheet of zinc-coated metal foil using a doctor blade set to form a puddle. A mat of glass fibers or chopped strands of fiber glass rope is then uniformly distributed across the polyester and epoxy resin layer carried on the zinc-coated metal foil. The polyester and epoxy resin coated metal foil then enters a laminating table, where a uniform temperature is maintained, which may be adjusted from about 50° F. (10° C.) to about 200° F. (93° C.). The temperature in the laminating table is preferably maintained between about 100° F. (38° C.) to about 200° F. (93° C.). The heat in the laminating table initiates gelation. In the process of the present invention, the polyester and epoxy resin coated metal foil preferably moves through the laminating table at a speed from about 10 to about 65 feet/min. (about 3 to about 20 meters/min.) and preferably at a speed between about 20 to about 35 feet/min. (about 6 to about 11 meters/min.).

Again referring to FIG. 1, a second zinc-coated metal foil may be applied to the partially gelled polyester and epoxy resin coated metal foil, leaving the laminating table and entering the squeeze rolls. As can be seen in FIG. 1, a zinc-coated metal foil sheet, such as a zinc-coated copper foil sheet, passes through a heater, where it is optionally heated to promote adhesion, as discussed above. Again, the zinc-coated metal foil may be supported by a cellophane carrier sheet, if desired. An important feature of the process of the present invention are the squeeze rolls shown at the point where the second metal foil meets the partially gelled polyester and epoxy resin. The squeeze rolls are to be adjusted for the final thickness of the laminate product, and may be adjusted to insure that a puddle of polyester and epoxy resin forms at this point on the line. That is, the amount of polyester and epoxy resin permitted through the doctor blade at the beginning of the line is greater than the amount of polyester and epoxy resin which is permitted to pass between the squeeze rolls when a second zinc-coated metal foil is used. The puddle of polyester and epoxy resin which forms at this point is important, because it coats the second zinc-coated metal foil sheet before the second sheet touches the partially gelled polyester and epoxy resin coating on the first metal foil. Coating the second zinc-coated metal sheet with polyester and epoxy resin before it contacts the polyester and epoxy resin coating on the first zinc-coated metal foil heats the second zinc-coated metal sheet to the temperature of the polyester and epoxy resin coating on the first sheet. Thus, this aspect of the process of the present invention both eliminates air bubbles and other imperfections which would interfere with the formation of a strong bond between the second metal foil and the partially gelled polyester and epoxy resin coating. Of course, it will be understood that if a single-sided product, containing a metal foil on one side of the polyester and epoxy material only, is desired, the second metal foil can be omitted from the process of the present invention. It will also be understood that the method described above may be used to prepare a layer of polyester and epoxy material only, which may later be bonded to one or more metal foils. The squeeze rolls apply pressure to the laminate to promote bonding both in the case of a single-sided product, and in the case of a double-sided product. In the process of the present invention, the squeeze rolls are generally set between about 0.010 to about 0.125 inch (about 0.025 to 0.318 cm). In the case of a double-sided product, the squeeze rolls are generally set between about 0.060 to about 0.125 inch (about 0.152 to 0.318 cm).

The laminate is thereafter cured in a multi-zone heat treatment. The oven zones are set up as follows:
  (1) Preheat section: in the range from about 250° to 350° F. (about 120° to 175° C.) to bring the laminate up to cure temperature quickly;
  (2) Gelation section: in the range from about 100° to 350° F. (about 38° to 175° C.). Temperature control in this zone must be carefully controlled to avoid runaway of the curing reaction;
  (3) Exotherm section: usually no heat is supplied since the curing resin is reaching its maximum temperature in this zone; and
  (4) Finish-off section: in the range from about 300° to about 500° F. (about 150° to 260° C.) to finish off curing the laminate.

After curing, the laminate is edge-trimmed to produce the desired width. Cellophane carrier sheets, if used, are also removed from the laminate after curing. Trimming is accomplished by shearing. When shearing single-sided copper-clad laminate into smaller blanks the foil side should face upward with the polyester and epoxy base material against the shear table. By cutting through the foil side first, there is less tendency to tear the foil away from the edge of the blank.

Figure 3:
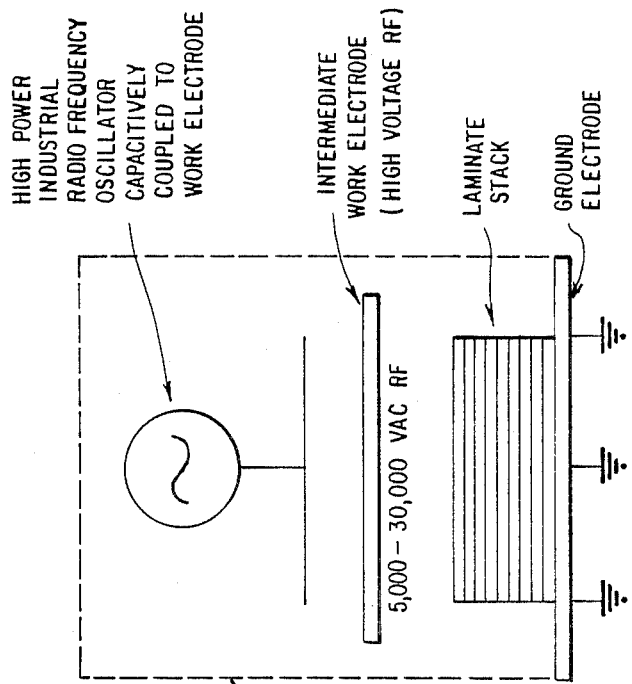
FIG. 3 is a schematic illustration of a post curing radio-frequency applicator.

Stacks of cut laminate weighing up to about 4,000 pounds are then introduced into a radio-frequency applicator (FIG. 3) and subjected to radio-frequency electromagnetic energy between about 1,000,000 and 500,000,000 cycles per second, a power input up to about 200,000 watts, and a field voltage between about 5,000 volts RMS and 50,000 volts RMS for a period between about 5 minutes and 1 hour. The temperature of the laminate rises between about 200° F. and 450° F. (90° C. to 230° C.). The post cured laminate is then automatically removed from the radio-frequency applicator and another stack of laminate is automatically introduced into the radio-frequency applicator.

The typical resins the system employed produce a total exothermic heat of reaction of about 300 joules per gram of resin upon complete cure. Laminate continuously produced and cured in a four-zone hot air oven system and exposed to temperatures between about 250° F. and 500° F. (120° C. and 260° C) for periods between about 5 minutes and 20 minutes exhibit residual cure between about 17 joules per gram of resin and 50 joules per gram of resin to complete cure. Subsequent post cure heating of laminate stacks to temperatures between 250° F. and 500° F. (120° C. and 260° C.) utilizing radiofrequency electromagnetic energy according to the present invention extends the degree of cure of the finished product to about 97° to 99°. The resulting improved cure improves copper peel bond strength, improves physical properties of the finished laminate, and improves performance and processability of the finished laminate.

According to the invention, the above described process may be applied to a layer or sheet of reinforced epoxy resin, that is, excluding the polyester component.

Figure 2:
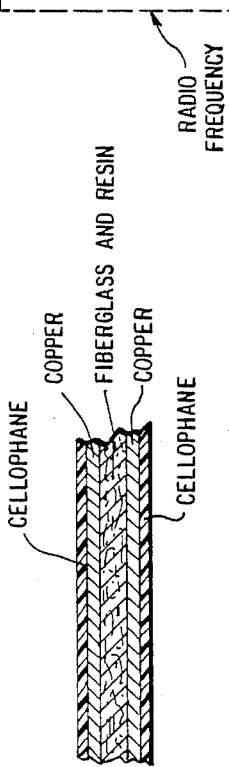
FIG. 2 is a schematic illustration of a copper-clad polyester and epoxy-glass fiber laminate according to the present invention, including optional cellophane carrier sheets.

FIG. 2 illustrates a laminate product produced by the process of the present invention. A double-sided product is illustrated, with cellophane carrier sheets. As noted above, the cellophane carrier sheets are removed from the laminate after curing.

Although the process of the present invention is particularly useful for bonding zinc-coated copper foil to a polyester and epoxy resin base for manufacturing an electrical circuit board and E.M.I.-R.F.I. shielding it is believed that other metals may be employed in the process of the present invention. For less costly printed circuit boards and shielding, zinc-coated aluminum foil may be substituted for the zinc-coated copper foil in the process of the present invention. Zinc-coated silver or gold foil may also be utilized for special purposes, and zinc-coated tantalum or titanium for resistance on circuits. In addition to electrical circuit boards and shielding, the process of the present invention may be used to produce structural laminates, for example, by bonding a zinc-coated aluminum foil to a corrugated polyester and epoxy resin base.

As used in this specification, an "electrogalvanized" zinc-coating means an electroplated zinc coating, plated directly on the metal substrate (e.g., copper) containing about 500 to about 1500 micrograms of zinc per square inch of coating.

EXAMPLES

Example 1

Using the process illustrated in FIG. 1, a one ounce copper foil, 39 inches wide, sold by Yates Industries, Inc., Beaumont, Calif. (Extra Heavy Zinc treated copper foil) is used to prepare a double-sided electrical circuit board. The same process is also used to prepare a single-sided electrical circuit board and E.M.I.-R.F.I. shielding. The polyester and epoxy resin, containing 0.1% by weight of cellulose acetate butyrate, is manufactured by Alpha Resins, a division of the Alpha Corporation of Collierville, Tenn. (Alpha polyester resin 59-60101). A catalyst is incorporated into the polyester resin in the following manner. To 200 lbs. of polyester resin, a catalyst system is added including 2 lbs. of cumene hydroperoxide, 0.4 lbs. of benzotrimethylammonium chloride, and 0.1 lbs. of a 16% by weight solution of zinc (Zinc 16 brand by Tenneco Corporation).

Blends of polyester and epoxy resins and other components are as follows:

64% LER 323 polyester resin (ortho-D.C.P. +Styrene +10% MMA modified resin).
14% 9801 Epoxy resin (70% 9850 curing agent 30%).
22 DE 83R (Brominated fire retardant resin).
3 P.H.R. Antimony Oxide (Fire retardant resin).
50 P.H.R. CA-5 (Calcium sulfate).
7628 Woven glass.
¾ oz. M-113 chopped strand mat.
0.5 P.H.R. VTMOEO (Coupling agent for glass and resin).
0.5 P.H.R. BYK-500 (Air release agent).
0.1 Zinc 16 (Part of a catalyst system).
1.0 Esperoz 28 P.D. (Heat curing peroxide system).

The copper foil is supported by a plain transparent cellophane sheet of 174 gauge. The catalyst-containing polyester and epoxy resin is poured on the copper foil at a rate sufficient to form a puddle to insure a uniform coating. The doctor blade is set at 0.105 inch (0.267 cm). Moving at a line speed of about 22 ft./min. (about 6.70 meters/min.), a glass mat amounting to 14% by weight, compared to the weight of the polyester and epoxy resin, is uniformly distributed onto the polyester and epoxy resin layer. The laminating table is operated at a temperature of 175° F. (80° C.). The glass mat weighs 1.5 ounces per square foot (Certainteed M113 glass mat).

The squeeze rolls are set at 0.068 inch (0.17 cm) and the curing zones in the four zone hot air oven system are set at 300° F. (149° C.) in the preheat section, 250° F. (121° C.) in the gellation section and 400° F. (204° C.) in the finish-off section The thickness of the single-sided product is 0.059 inch (0.15 cm).

The partially cured single-sided product is cut into 11-inch (28 cm) squares and stacked to produce a stack of 11-inch (28 cm) squares weighing 31 pounds (14 kilograms). The partially cured single-sided product was then introduced between the work electrodes of a radio frequency generator delivering approximately 4,000 watts of energy at 90,000,000 cycles per second. The work electrode voltage is approximately 20,000 volts RMS. The following results are obtained.

Sample: 31.0 lbs 11"×11"(0.50"Thick single sided)
Beginning Temperature: 75 F.
Ending Temperature: 315 F.
Radio Frequency Oscillator Plate Power Input: 2.8–5.3 kilowatts
Radio Frequency Oscillator Plate Power Output: 1.9–3.5 kilowatts
Total Heating Time: 15 min
Temperature Variation in Sample: 10 F. max
Cure before RF heating: 94% (17 joules/gram residual)
Cure after RF heating: 99% (1.6 joules/gram residual)
Peel Bond before: 7.39 lb/inch
Peel Bond after: 8.98 lb/inch

EXAMPLE 2

The process of the above Example is repeated using a second (top) copper foil applied to the partially gelled resin. The second copper foil is of the same material as the first copper foil, and is supported on a plain transparent cellophane carrier of 48 gauge. The thickness of the double-sided product is 0.062 inch (0.176 cm). The partially cured double-sided product is cut into 11-inch (28 cm) squares and stacked to produce a stack weighing 34 pounds (15 kilograms). The partially cured double-sided product is then introduced between the work electrodes of a radio frequency generator delivering approximately 4,000 watts of energy at 90,000,000 cycles per second. The work electrode voltage is approximatly 20,000 volts RMS. The following results are obtained:

Sample: 34.0 lbs 11"×11"(0.59"thick double sided)
Beginning Temperature: 75 F.
Ending Temperature: 350 F.
Radio Frequency Oscillator Plate Power Input: 4:0–6.0 kilowatts
Radio Frequency Oscillator Plate Power Output: 2.7–4.0 kilowatts
Total Heating Time: 12 min
Temperature Variation in Sample: 10 F.
Cure before RF heating: 88.6% (34.3 joules/gram residual)
Cure after RF heating: 97.4% (7.9 joules/gram residual)
Peel bond before: 9.44 lbs/inch
Peel bond after: 10.61 lbs/inch If the semi-finished partially cured product describe above were postcured in hot air ovens, more than 12 hours would be required to reach postcuring temperature and the temperature distribution within the stacks would exceed 50° F. (28° C.) variation.

It is understood that various other modifications will be apparent to and can readily be made by those skilled in the art without departing from the scope and spirit of this invention. Accordingly, it is not intended that the scope of the claims appended hereto be limited to the description set forth above but rather that the claims be construed as encompassing all the features of patentable novelty which reside in the present invention, including all features which would be treated as equivalents thereof by those skilled in the art to which the invention pertains.

What is claimed is:

1. A continuous process for preparing a metal foil laminate having at least one sheet of zinc-coated metal foil directly bonded to a face of a sheet of a glass fiber reinforced polyester and epoxy resin, comprising:
    applying a coating of a polyester and epoxy resin, said resin consisting essentially of from about 80% to about 90% by weight polyester and from about 10% to about 20% by weight epoxy, to a first zinc-coated metal foil;
    uniformly distributing glass fiber on said polyester and epoxy resin coating;
    heating said glass fiber containing polyester and epoxy resin coated metal foil to partially gel said resin;
    applying pressure to said partially gelled glass fiber containing polyester and epoxy resin coated metal foil; and
    curing said glass fiber containing polyester and epoxy resin using radio-frequency electromagnetic energy to directly bond said glass fiber containing polyester and epoxy resin to said first zinc-coated metal foil.

2. The continuous process for preparing a metal foil laminate as set forth in claim 1, including applying a second zinc-coated metal foil to said partially gelled polyester and epoxy resin coating on said first zinc-coated metal foil immediately after heating said glass fiber containing polyester and epoxy resin coated first metal foil and directly bonding said glass fiber containing polyester and epoxy resin to said first zinc-coated metal foil, and to said zinc-coated metal foil.

3. The continuous process for preparing a metal foil laminate as set forth in claim 1, wherein said sheet of glass fiber reinforced polyester and epoxy resin is rigid.

4. The continuous process for preparing a metal foil laminate as set forth in claim 1, wherein said sheet of glass fiber reinforced polyester and epoxy resin is flexible.

5. The continuous process for preparing a metal foil laminate as set forth in claim 1, wherein said zinc-coated metal foil is an electrogalvanized zinc-coated metal foil.

6. The continuous process for preparing a metal foil laminate as set forth in claim 1, wherein said zinc-coated metal foil is a zinc-coated copper foil.

7. The continuous process for preparing a metal foil laminate as set forth in claim 3, wherein said zinc-coated metal foil is a zinc-coated copper foil.

8. The continuous process for preparing a metal foil laminate as set forth in claim 4, wherein said zinc-coated metal foil is zinc-coated copper foil.

9. The continuous process for preparing a metal foil laminate as set forth in claim 1, wherein said glass fiber is a glass mat uniformly applied on said polyester and epoxy resin coating.

10. The continuous process for preparing a metal foil laminate as set forth in claim 1, including distributing about 10% to about 30% by weight, compared to the resin, of glass fiber on said polyester and epoxy resin coating.

11. A continuous process for preparing a metal foil laminate having at least one sheet of zinc-coated metal foil directly bonded to a face of a sheet of a glass fiber reinforced epoxy resn, comprising:
    applying a coating consisting essentially of an epoxy resin to a first zinc-coated metal foil;
    uniformly distributing a glass fiber on said epoxy resin coating;
    heating said glass fiber containing epoxy resin coated metal foil to partially gel said resin;
    applying pressure to said partially gelled glass fiber containing epoxy resin coated metal foil; and
    curing said glass fiber containing epoxy resin using radio-frequency electromagnetic energy to directly bond said glass fiber containing epoxy resin to said first zinc-coated metal foil.

12. The continuous process for preparing a metal foil laminate as set forth in claim 11, including applying a second zinc-coated metal foil to said partially gelled epoxy resin coating on said first zinc-coated metal foil immediately after heating said glass fiber containing epoxy resin coated first metal foil and directly bonding said glass fiber containing epoxy resin to said first zinc-coated metal foil and to said second zinc-coated metal foil.

13. A continuous process for preparing a sheet of a glass fiber reinforced polyether and epoxy resin, comprising:
    applying a coating of a polyester and epoxy resin, said resin consisting essentially of from about 80% to about 90% by weight polyester and from 10% to about 20% by weight epoxy, to a carrier sheet;
    uniformly distributing glass fiber on said polyester and epoxy resin coating;
    heating said glass fiber containing polyester and epoxy resin coated carrier sheet to partially gel said resin;
    curing said glass fiber containing polyester and epoxy resin sheet using radio frequency electromagnetic energy; and removing said carrier sheet.

14. The continuous process for preparing a sheet of a glass fiber reinforced polyester and epoxy resin as set forth in claim 13, wherein said sheet is rigid.

15. The continuous process for preparing a sheet of a glass fiber reinforced polyester and epoxy resin as set forth in claim 13, wherein said sheet is flexible.

16. The continuous process for preparing a sheet of a glass fiber reinforced polyester and epoxy resin as set forth in claim 13, wherein said glass fiber is a glass mat uniformly applied on said polyester and epoxy resin coating.

17. The continuous process for preparing a sheet of a glass fiber reinforced polyester and epoxy resin as set forth in claim 13, including distributing about 10% to about 30% by weight, compared to the resin, of glass fiber on said polyester and epoxy resin.

18. The continuous process for preparing a metal foil laminate as set forth in claim 1, wherein said polyester and epoxy resin coating consists of from about 80% to about 90% by weight polyester and from about 10% to about 20% by weight epoxy.

19. The continuous process for preparing a metal foil laminate as set forth in claim 11, wherein said coating consists of an epoxy resin.

20. The continuous process for preparing a sheet of glass fiber reinforced polyester and epoxy resin as set forth in claim 13, wherein said coating consists of from about 80% to about 90% by weight polyester and from about 10% to about 20% by weight epoxy.

* * * * *